(12) United States Patent
Tanaka et al.

(10) Patent No.: US 9,478,670 B2
(45) Date of Patent: Oct. 25, 2016

(54) NON-VOLATILE SEMICONDUCTOR STORAGE DEVICE

(71) Applicant: KABUSHIKI KAISHA TOSHIBA, Tokyo (JP)

(72) Inventors: Masayuki Tanaka, Mie-ken (JP); Kenichiro Toratani, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 122 days.

(21) Appl. No.: 13/936,453

(22) Filed: Jul. 8, 2013

(65) Prior Publication Data
US 2014/0061756 A1  Mar. 6, 2014

(30) Foreign Application Priority Data

Sep. 5, 2012 (JP) ................. 2012-195224

(51) Int. Cl.
| | |
|---|---|
| *H01L 29/792* | (2006.01) |
| *H01L 21/28* | (2006.01) |
| *H01L 29/788* | (2006.01) |
| *H01L 27/115* | (2006.01) |
| *H01L 29/423* | (2006.01) |

(52) U.S. Cl.
CPC ....... *H01L 29/792* (2013.01); *H01L 21/28273* (2013.01); *H01L 21/28282* (2013.01); *H01L 27/11521* (2013.01); *H01L 27/11568* (2013.01); *H01L 29/4234* (2013.01); *H01L 29/42324* (2013.01); *H01L 29/7887* (2013.01); *H01L 29/7923* (2013.01)

(58) Field of Classification Search
CPC ................................. H01L 27/11517
See application file for complete search history.

(56) References Cited

U.S. PATENT DOCUMENTS

2001/0055838 A1 * 12/2001 Walker et al. ............... 438/129
2008/0087937 A1    4/2008 Akahori et al.
(Continued)

FOREIGN PATENT DOCUMENTS

| JP | 2008-004913 | 1/2008 |
|---|---|---|
| JP | 2008-008301 | 1/2008 |

(Continued)

OTHER PUBLICATIONS

Hang-Ting Lue et al., "A Novel Planar Floating-Gate (FG)/Charge-Trapping (CT) NAND Device Using BE-SONOS Inter-Poly Dielectric (IPD)", IEDM, 2009 IEEE.

*Primary Examiner* — Mohammad Choudhry
(74) *Attorney, Agent, or Firm* — Patterson & Sheridan, LLP

(57) ABSTRACT

A non-volatile semiconductor storage device disclosed in the embodiment has a semiconductor substrate, a first insulating film, a first charge storage film, a second insulating film, a second charge storage film, a third insulating film, and a control electrode. In this non-volatile semiconductor storage device, the first and second charge storage films comprise a metallic material, a semi-metallic material or a semiconductor material. One of the first, second, and third insulating films is a multi-layered insulating film formed by layering multiple insulating films. This non-volatile semiconductor storage device further has a film comprising of any one of an oxide film, nitride film, boride film, sulfide film, and carbide film that is in contact with one interface of the laminated insulating film and contains one type of atom selected from aluminum, boron, alkaline earth metal, and transition metal at a concentration in the range of 1E12 atoms/cm$^2$ to 1E16 atoms/cm$^2$.

8 Claims, 12 Drawing Sheets

(56) References Cited

U.S. PATENT DOCUMENTS

| | | |
|---|---|---|
| 2008/0121978 A1 | 5/2008 | Sawamura |
| 2009/0035904 A1 | 2/2009 | Bhattacharyya |
| 2009/0065851 A1 | 3/2009 | Lue et al. |
| 2009/0189213 A1 | 7/2009 | Matsuo et al. |
| 2009/0321810 A1* | 12/2009 | Ryu et al. ............ 257/321 |
| 2010/0034023 A1* | 2/2010 | Shingu et al. ......... 365/185.18 |
| 2011/0122698 A1 | 5/2011 | Izumida et al. |
| 2011/0272754 A1* | 11/2011 | Tang et al. ............ 257/314 |
| 2012/0313218 A1* | 12/2012 | Fujimori et al. ......... 257/532 |

FOREIGN PATENT DOCUMENTS

| | | |
|---|---|---|
| JP | 2008-009321 | 1/2008 |
| JP | 2008-016681 | 1/2008 |
| JP | 2008-098510 | 4/2008 |
| JP | 2008-136568 | 6/2008 |
| JP | 2008-541487 | 11/2008 |
| JP | 2009-170781 | 7/2009 |
| JP | 2009-266591 | 11/2009 |
| JP | 2010-027967 | 2/2010 |
| JP | 2011-114034 | 6/2011 |

* cited by examiner

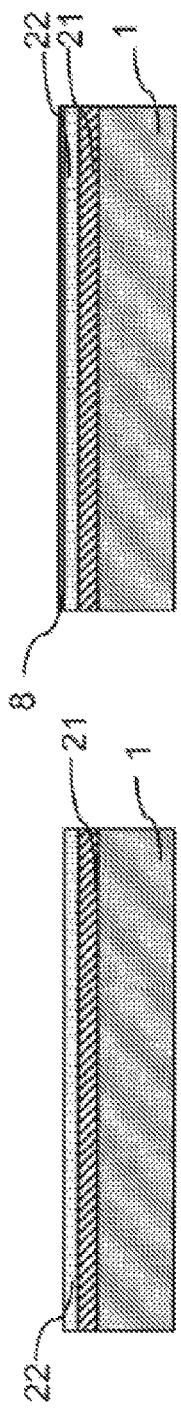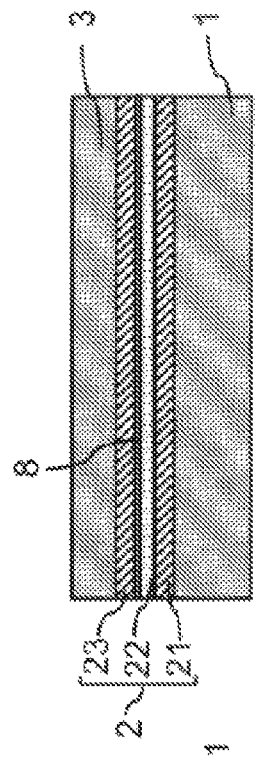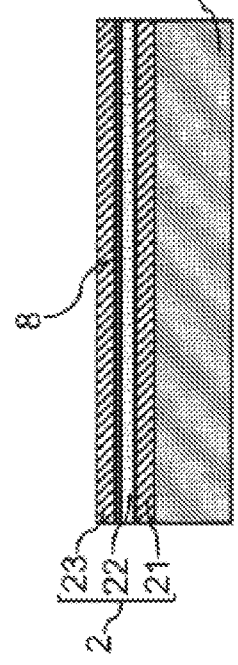

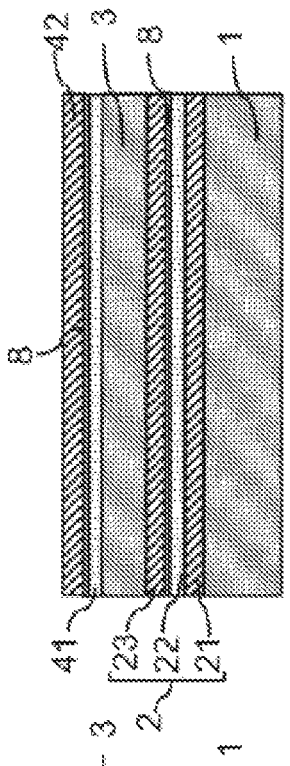
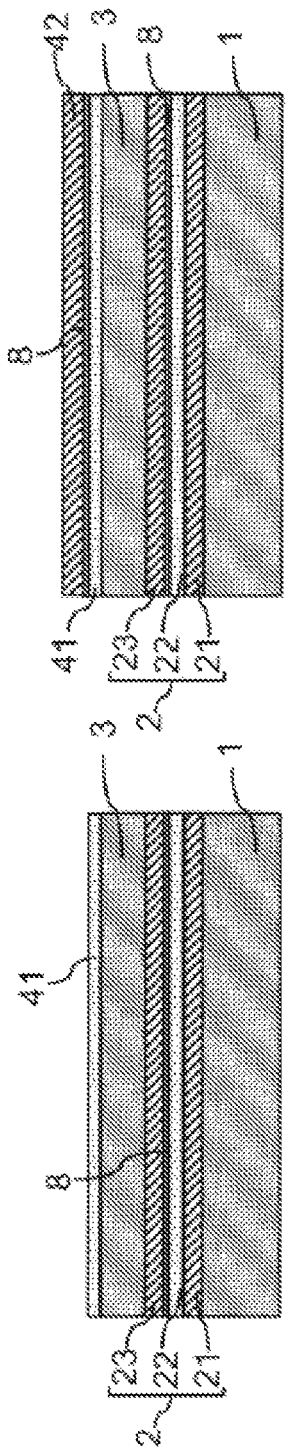

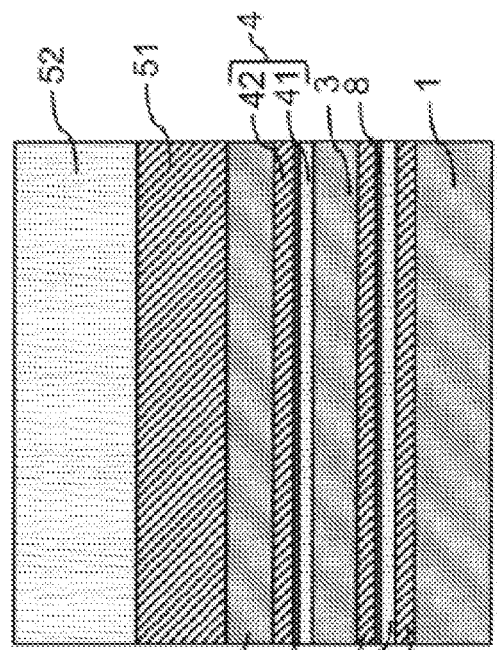
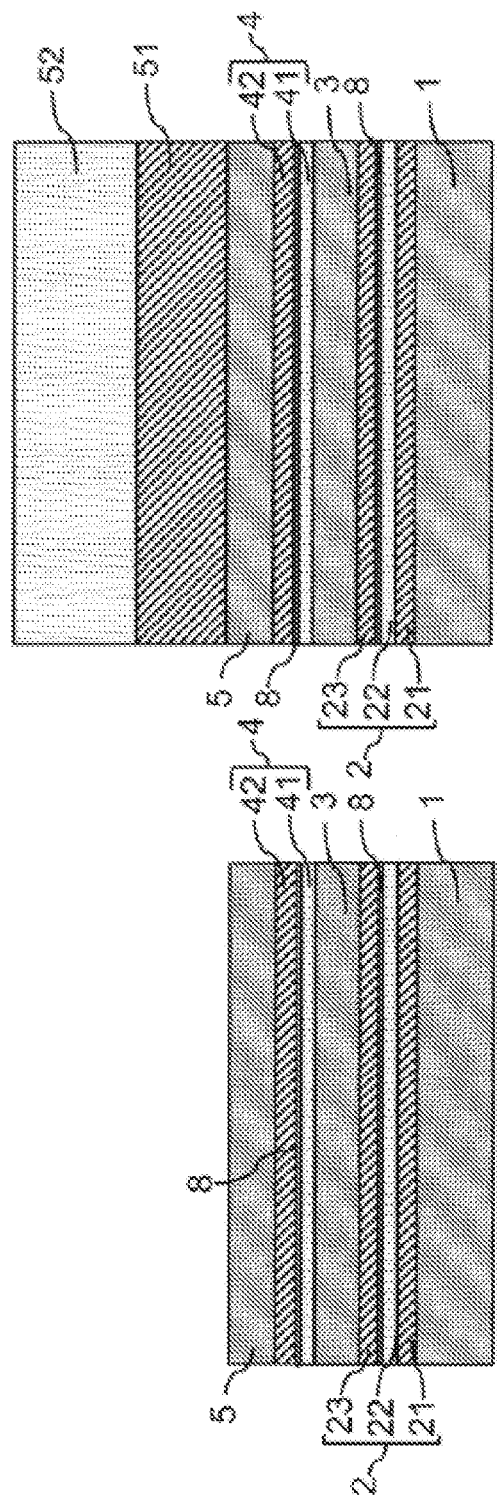

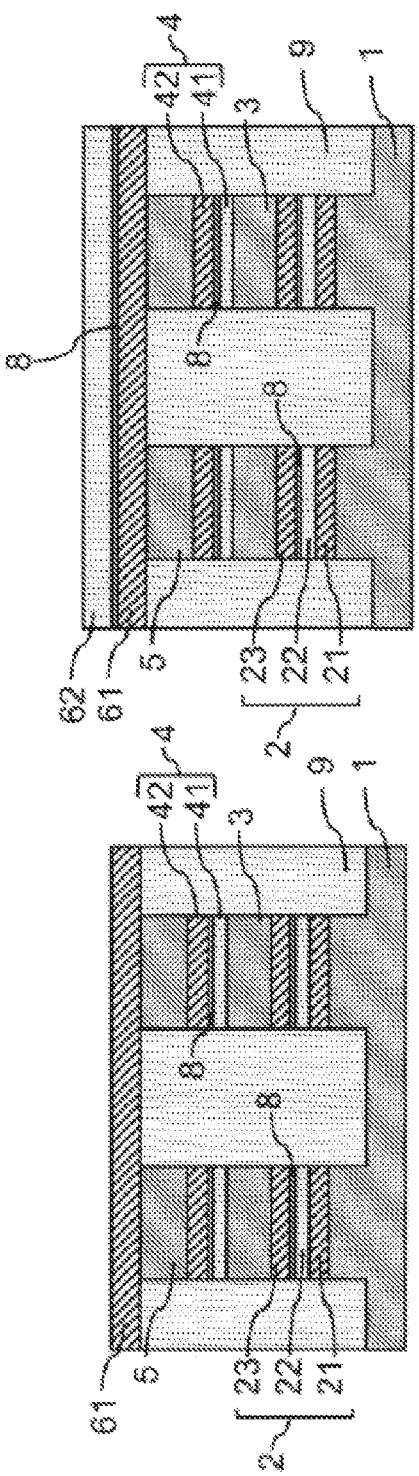

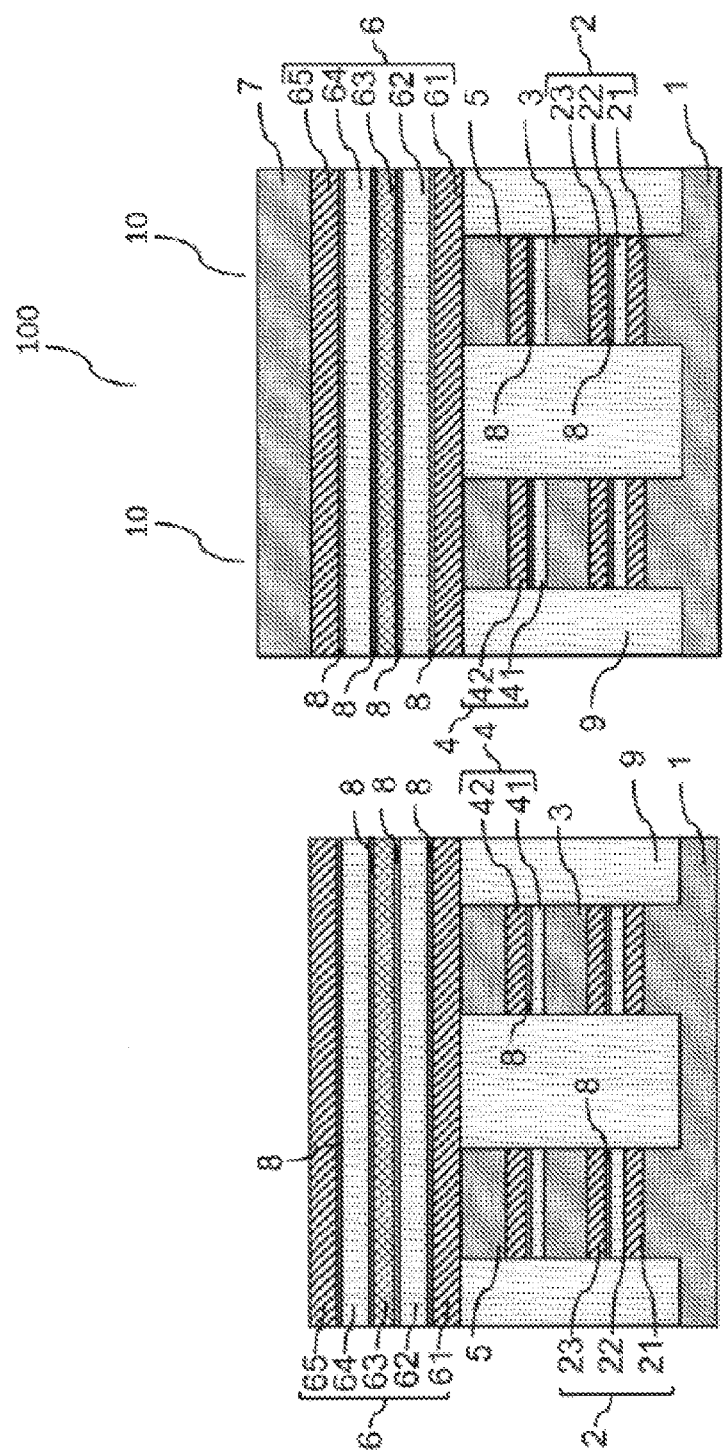

NON-VOLATILE SEMICONDUCTOR STORAGE DEVICE

CROSS-REFERENCE TO RELATED APPLICATION

This application is based upon and claims the benefit of priority from Japanese Patent Application No. 2012-195224, filed Sep. 5, 2012; the entire contents of which are incorporated herein by reference.

FIELD

Embodiments described herein relate to a non-volatile semiconductor storage device.

BACKGROUND

For floating gate (Floating Gate)-type non-volatile semiconductor storage device, a desired device can be realized by using a 3-dimensional cell structure. More specifically, a floating gate-type non-volatile semiconductor storage device with a 3-dimensional cell structure has a structure formed by sequentially forming a tunnel insulating film, a floating gate (FG) material used as a charge storage film, an IPD (Inter Poly Dielectric) film, and a CG (Control Gate) one above the other on a semiconductor substrate. In the resulting device, the IPD film covers not only the top surface of the floating gate but also the sidewalls thereof. However, when the distance between adjacent memory cells in the non-volatile semiconductor storage device is reduced, it becomes difficult to provide a space between the control gate of the memory cells in the 3-dimensional cell structure described above. Therefore, a flat cell structure with an IPD film having a flat structure formed on the top surface of the floating gate has been proposed. In the related 3-dimensional cell structure, when the IPD film is formed into a structure that also covers the sidewall parts of the floating gate, the area of the IPD film is increased, and the capacitance ratio between the tunnel insulating film and the IPD film is increased. In the flat cell structure, however, since the area ratio of the tunnel insulating film to the IPD film is almost 1, it is difficult to increase the capacitance ratio. Therefore, it is difficult to apply sufficient electric field to the tunnel insulating film during writing/erasing.

Therefore, as one of the methods for improving the writing/erasing characteristic of the non-volatile semiconductor storage device having a flat cell structure, a structure having two floating gate layers (double floating gate type cell) is proposed. This double floating gate-type cell structure has three kinds of insulating films, that is, a tunnel insulating film formed on a semiconductor substrate, an IFD (Inter Floating-Gate Dielectric) film formed between the two floating gate layers of, and an IPD film formed between floating gate and control gate layers. More specifically, this IFD film is an insulating film used for insulating between the floating gate formed into two layers. Since the double floating gate-type cell has two layers of floating gate, charges can also be stored in the upper floating gate that is further away from the semiconductor substrate. Also, since the upper floating gate is in contact with the semiconductor substrate via two insulating films, the stored charges are difficult to extract compared with the charges stored in the lower floating gate that is closer to the semiconductor substrate.

DESCRIPTION OF THE DRAWINGS

FIGS. 6A and 6B are examples of diagrams explaining a fabrication process (part 1) of the non-volatile semiconductor storage device according to this embodiment.

FIGS. 7C and 7D are examples of diagrams explaining a fabrication process (part 2) of the non-volatile semiconductor storage device according to this embodiment.

FIGS. 8E and 8F are examples of diagrams explaining a fabrication process (part 3) of the non-volatile semiconductor storage device according to this embodiment.

FIGS. 9G and 9H are examples of diagrams explaining a fabrication process (part 4) of the non-volatile semiconductor storage device according to this embodiment.

FIGS. 11K and 11L are examples of diagrams explaining a fabrication process (part 6) of the non-volatile semiconductor storage device according to this embodiment.

FIGS. 13O and 13P are examples of diagrams explaining a fabrication process (part 8) of the non-volatile semiconductor storage device according to this embodiment.

DETAILED DESCRIPTION

In general, according to one embodiment, the present invention will be described with reference to the drawings. The present invention, however, is not limited this embodiment. The same parts in all of the drawings are represented by the same respective numbers and symbols and an explanation thereof will not be repeated for each figure. Also, the drawings are schematic drawings used for explaining the invention and for easy understanding of the invention. The shapes, dimensions, ratios, and the like may be different from those of the actual device, and the design can be varied appropriately with reference to the following explanation and the well-known technologies.

A non-volatile semiconductor storage device according to the embodiment of the present invention has a semiconductor substrate, a first insulating film formed on the semiconductor substrate, a first charge storage film formed on the first insulating film, a second insulating film formed on the first charge storage film, a second charge storage film formed on the second insulating film, a third insulating film formed on the second charge storage film, and a control electrode formed on the third insulating film. In this non-volatile semiconductor storage device, the first and second charge storage films are formed of a metallic material, a semi-metallic material or a semiconductor material. One of the first, second, and third insulating films is a (multi-layered) insulating film formed by laminating multiple insulating films. This non-volatile semiconductor storage device further has a film comprising any one of an oxide film, nitride film, boride film, sulfide film, and carbide film that is in contact with one interface of the multilayered insulating film and contains one type of atom selected from aluminum, boron, an alkaline earth metal, or a transition metal at a concentration in the range of 1E12 atoms/cm$^2$ to 1E16 atoms/cm$^2$.

In the following, a non-volatile semiconductor storage device 100 having a double floating gate-type cell structure of this embodiment will be described based on FIGS. 1 and 2. In this case, an example of applying this embodiment to various kinds of insulating films in the non-volatile semiconductor storage device 100 will be described. The present invention, however, is not limited to this but can be applied to other semiconductor devices or other parts.

Figure 1:
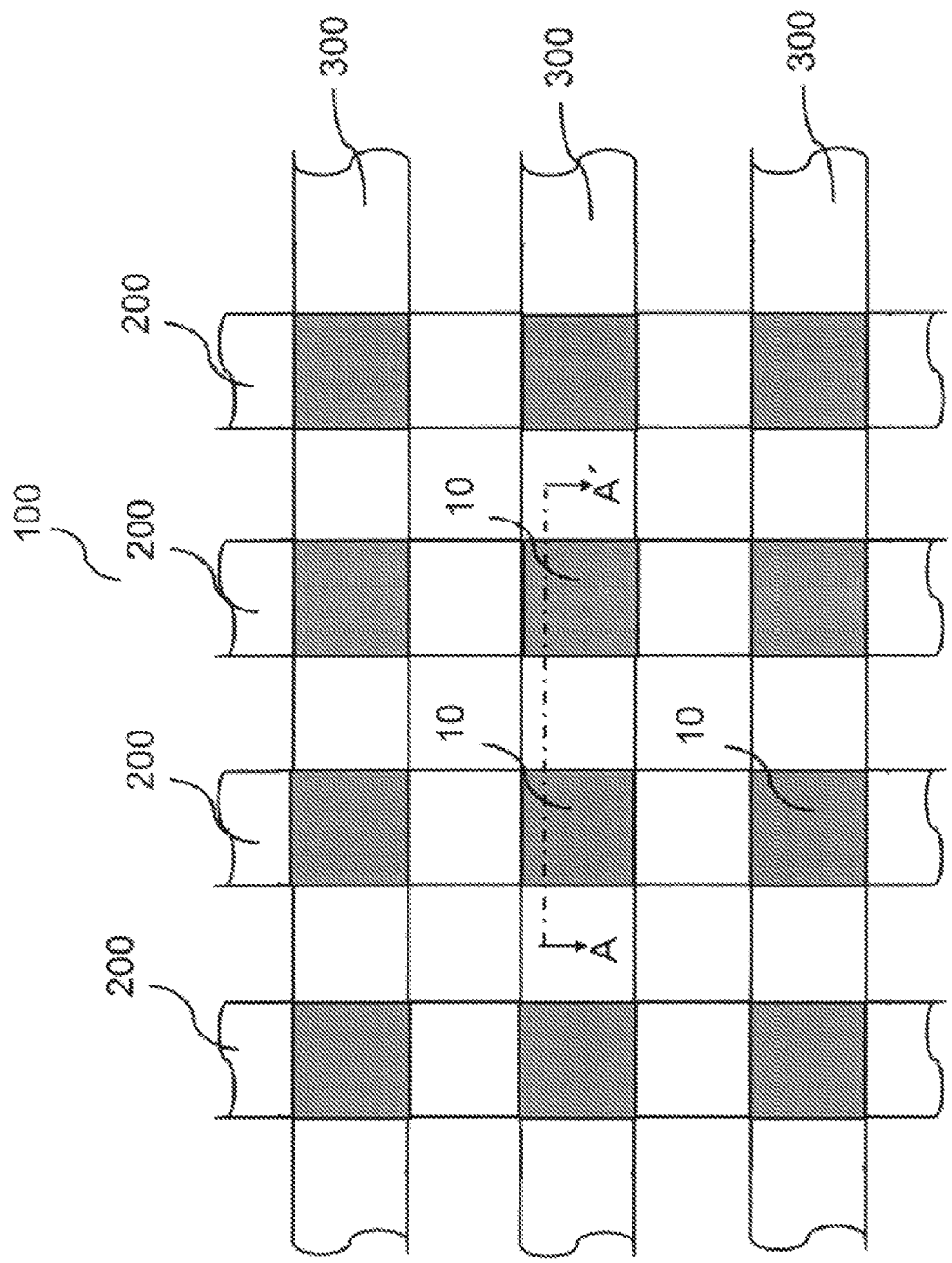
FIG. 1 is one example of a plan view of a non-volatile semiconductor storage device according to this embodiment.

FIG. 1 is a plan view of the non-volatile semiconductor storage device 100 according to this embodiment. As shown in FIG. 1, for the non-volatile semiconductor storage device 100 according to this embodiment, multiple bit lines 200 are formed along the vertical direction on the paper surface, and these multiple bit lines 200 are arranged at regular intervals in the horizontal direction of the paper, parallel to one another. Multiple word lines (CG) 300 are formed perpendicular to multiple bit lines 200 in the plan view. Multiple memory cells 10 are formed in multiple sections formed where the bit lines 200 cross with the word lines 300 in a three-dimensional array. In other words, the multiple memory cells 10 are disposed in a matrix pattern in a memory cell region of the non-volatile semiconductor storage device 100.

In the following, the non-volatile semiconductor storage device 100 according to this embodiment will be described with reference to FIG. 2, which is a cross-sectional view of memory cell region of the non-volatile semiconductor storage device 100, along section A-A' of FIG. 1. As shown in FIG. 2, an element separation insulating film 9 comprising, for example, a silicon oxide film is disposed between the adjacent memory cells 10. Each memory cell 10 has a double floating gate-type cell structure, which is formed by sequentially forming a tunnel insulating film 2, a lower floating gate 3, an IFD film 4, an upper floating gate 5, an IPD film 6, a CG 7 on the semiconductor substrate 1.

The lower floating gate 3, the upper floating gate 5, and the CG 7 includes metal films, semi-metal films, or semiconductor films, for example, polysilicon films. It is preferred that the thickness of these films is selected in accordance with the desired characteristics of the non-volatile semiconductor storage device 100.

The tunnel insulating film 2, the IFD film 4, and the IPD film 6 comprise multi-layer insulating films formed by sequentially forming multiple insulating films. More specifically, as shown in FIG. 2, a multi-layer insulating film comprising a silicon nitride film 21/silicon oxide film 22/silicon nitride film 23 (NON) stack is used as the tunnel insulating film 2. A multi-layer insulating film comprising a silicon oxide film 41/silicon nitride film 42 (ON) stack is used as the IFD film 4. A multi-layer insulating film comprising a silicon nitride film 61/silicon oxide film 62/hafnium oxide film 63/silicon oxide film 64/silicon nitride film 65 (NOHON) stack is used as the IPD film 6. The details of the films will be described later. In this embodiment, the tunnel insulating film 2, the IFD film 4, and the IPD film 6 are not limited to the multi-layer insulating films described above but can use various kinds of well-known multi-layer structures. For example, as shown in FIG. 3, a multi-layer insulating film comprising a silicon oxide film 24/silicon nitride film 25 (ON) is used as a tunnel insulating film 2. A multi-layer insulating film comprising a silicon nitride film 43/silicon oxide film 44/hafnium oxide film 45/silicon oxide film 46/silicon nitride film 47 (NOHON) stack is used as the IFD film 4. A multi-layer insulating film comprising a silicon nitride film 66/silicon oxide film 67/hafnium oxide film 68/silicon nitride film 69 (NOHN) stack is used as the IPD film 6. It is preferred that the thickness of each film constituting the laminated insulating film is selected in accordance with the desired characteristics of the non-volatile semiconductor storage device 100.

Figure 2:
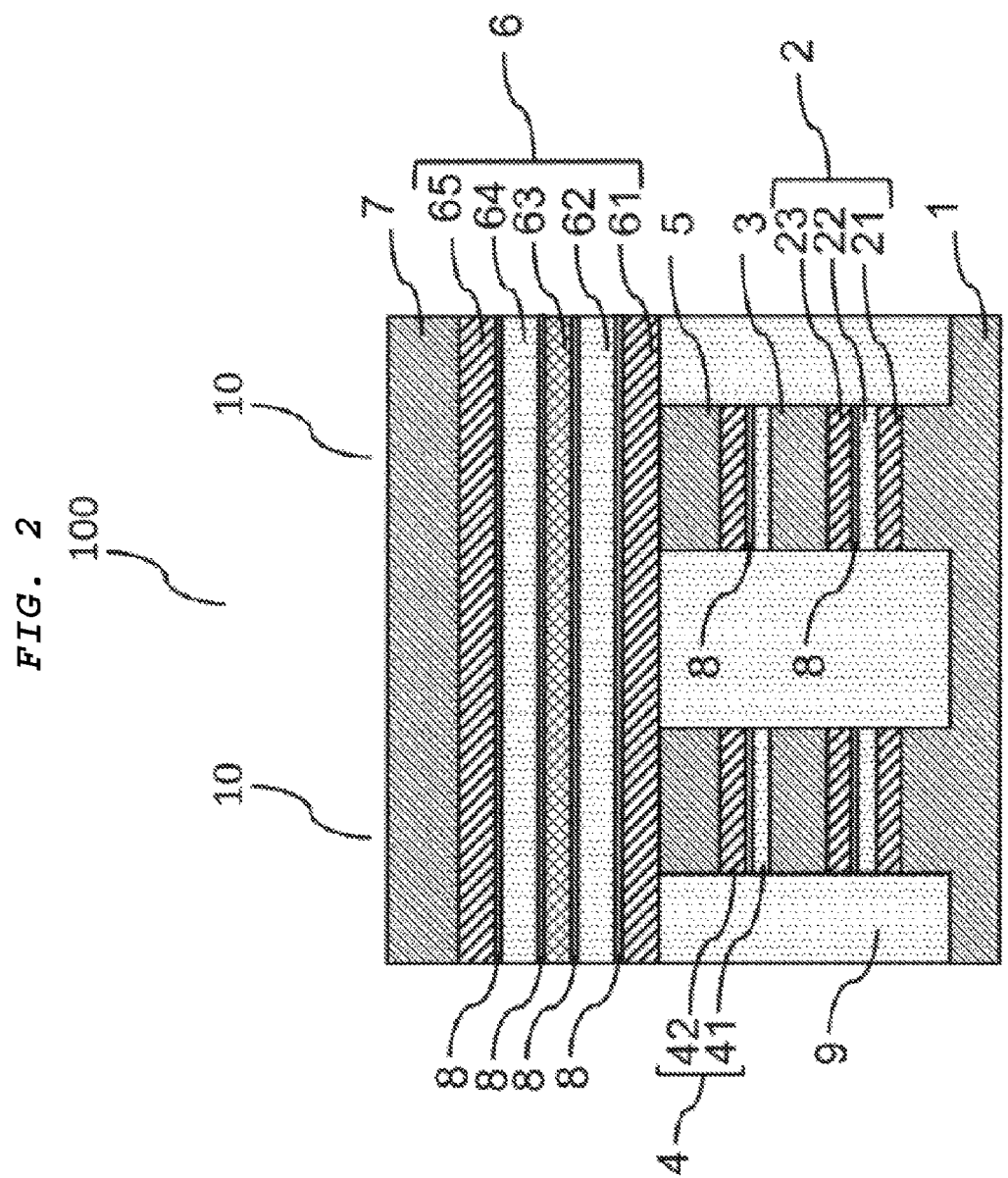
FIG. 2 is one example of a cross-sectional view of the non-volatile semiconductor storage device according to this embodiment.
Figure 3:
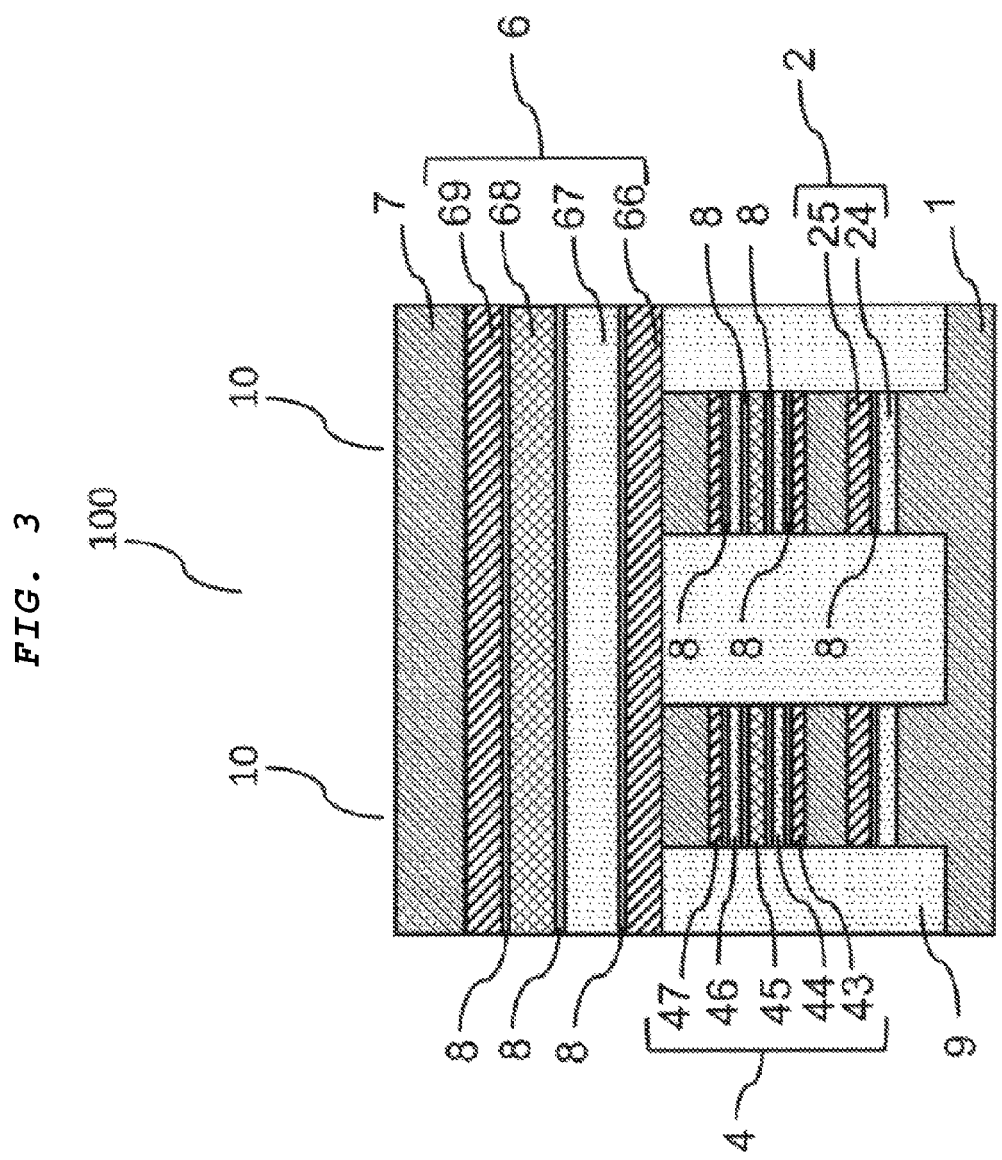
FIG. 3 is one example of a cross-sectional view of the non-volatile semiconductor storage device according to a modification example of this embodiment.

Also, as shown in FIG. 2, individual layers 8 containing aluminum or the like are formed in contact with six interfaces out of the seven interfaces of the laminated insulating films that constitute the tunnel insulating film 2, the IFD film 4, and the IPD film 6. More specifically, a layer 8 containing aluminum or the like is formed in contact with the interface between the silicon oxide film 22 and the upper silicon nitride film 23 of the tunnel insulating film 2. A layer 8 containing aluminum or the like is formed in contact with all of the interfaces of the laminated insulating film that constitute the IFD film 4 and all of the interfaces of the laminated insulating film that constitutes the IPD film 6. As shown in FIG. 3, a layer 8 containing aluminum or the like is formed in contact with all of the interfaces of the laminated insulating films that constitute the tunnel insulating film 2, the IFD film 4, and the IPD film 6. When this structure is adopted, the writing/erasing/retention characteristic and reliability of the non-volatile semiconductor storage device 100 can be improved. In this embodiment, the formation of layers 8 containing aluminum or the like is not limited to the positions shown in FIGS. 2 and 3 or having contact with all of the interfaces of the laminated insulating films. The layers 8 containing aluminum or the like can be formed to have contact with at least one of the multiple interfaces of the laminated insulating films. Consequently, it is preferred that the position where a layer 8 containing aluminum or the like is formed is selected in accordance with the desired characteristics of the non-volatile semiconductor storage device 100.

More specifically, a layer 8 containing aluminum or the like is, for example, a one atomic layer thick. In other words, the layer containing aluminum or the like is formed by arranging aluminum atoms side by side. In this embodiment, however, a layer 8 containing aluminum or the like is not limited to the film shape. It is also possible to arrange aluminum atoms or other atoms on each interface instead of forming a film-like layer 8 containing aluminum or the like. The details of the atoms included in the layer 8 containing aluminum or the like will be described later herein.

There is no special limitation on the layer 8 containing aluminum or the like in this embodiment as long as it is formed of aluminum oxide, aluminum nitride, aluminum carbide, aluminum boride, aluminum sulfide, or the mixture thereof.

In this embodiment, the layer 8 containing aluminum or the like is not limited to a layer containing aluminum or the like but can also be a layer containing the following atoms in place of or in combination with aluminum: beryllium, magnesium, calcium, strontium, barium, or other alkaline earth metals, yttrium, lanthanum, cerium, titanium, zirconium, hafnium, tantalum, or other transition metals, boron and the like, and the compounds thereof, such as oxides, nitrides, borides, sulfides, carbides. By carrying out an appropriate processing, it is also possible to use a layer containing the aforementioned atoms instead of the layer 8 containing aluminum or the like.

The details of the concentration of the atoms of aluminum or the like contained in the layer 8 containing aluminum or the like will be described later. The surface density is preferred to be in the range of 1E12 atoms/cm$^2$-1E16 atoms/cm². For example, if the layer 8 containing aluminum or the like comprises an aluminum oxide film and it is desired to acquire density of the aluminum atoms in the range of 1E12 atoms/cm²-1E16 atoms/cm², the thickness of layer 8 containing aluminum or the like is in the range of 0.001 nm to 1 nm.

In this embodiment, it is preferred to optimize the type and concentration of the atoms contained in the layer 8 containing aluminum or the like and the oxygen density corresponding to the desired characteristics of the non-volatile semiconductor storage device 100 and the site in the memory cell 10.

According to this embodiment, when the layer 8 containing aluminum or the like is formed in contact with at least one of the multiple interfaces of the laminated insulating films constituting the tunnel insulating film 2, the IFD film 4, and the IPD film 6, the writing/erasing/retention characteristic of the non-volatile semiconductor storage device 100 can be improved. Also, the electrical stress resistance during writing/erasure can be improved to realize better reliability. It is inferred that an energy band structure on the interfaces of the laminated insulating films changes when the layer 8 containing aluminum or the like is formed. The details of this will be described below.

In the following, an example, in which the layer 8 containing aluminum or the like is formed in contact with the interfaces of a laminated insulating film formed by laminating a silicon oxide film on a silicon nitride film, will be described.

When the layer 8 containing aluminum or the like is formed on a silicon nitride film, since the aluminum atoms are easy to oxidize, even if the layer 8 containing aluminum or the like is formed as an aluminum metallic film, a thin aluminum oxide film (as described above, this aluminum oxide film also includes a non-film form, that is, the simple presence of aluminum atoms and oxygen atoms) is formed on the surface. When a silicon oxide film is formed on the aluminum oxide film, since the oxygen density of the layers at the interface therebetween is different, the oxygen ions shift to the side where the oxygen density has a low concentration to alleviate the difference in the oxygen density on the interface. More specifically, for an aluminum oxide film and a silicon oxide film, since the aluminum oxide film has higher oxygen density, the oxygen ions in the aluminum oxide film shift to the side of the silicon oxide film on the interface between the aluminum oxide film and the silicon oxide film. Also, if the aluminum oxide film is thin, since the bonds therein are weak, it is believed that the oxygen ions can shift easily. When the oxygen ions shift as described above, electric dipoles are generated on the interface formed by different oxide films. These electric dipoles change the energy band structure on the interface of the oxide films. More specifically, when electric dipoles are generated such that the positive charges are disposed in the oxide film acting as the charge (electron) injection side and the negative charges are disposed in the oxide film positioned on the opposite side against the charge injection side, since the energy band structure is changed on the side where the barrier against the charges is increased, that is, since the energy band structure is changed such that the barrier height (electron barrier) of the silicon oxide film becomes higher, the tunnel probability of the charges is reduced so that leakage of the charges can be prevented. Consequently, when this film is used as an insulating film in the non-volatile semiconductor storage device 100, the writing/erasing/retention characteristics can be improved.

Figure 4:
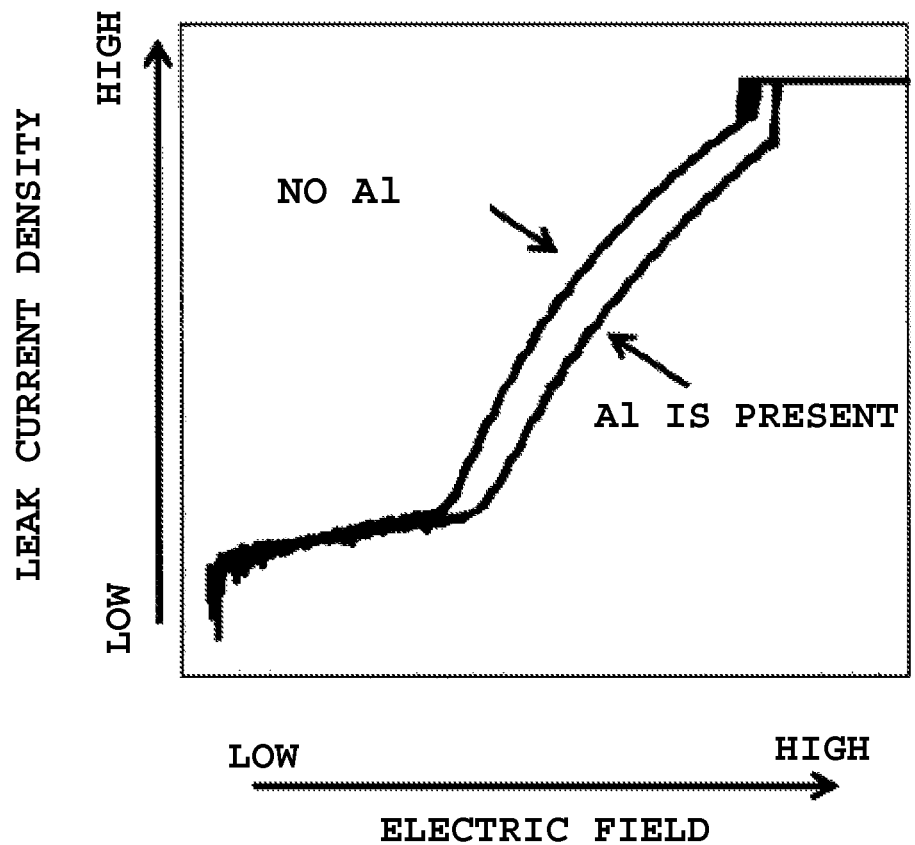
FIG. 4 is one example of a diagram (part 1) explaining this embodiment.

In order to confirm that the tunneling probability of charges is reduced, that is, the leak current is reduced by forming the layer 8 containing aluminum or the like (in this case, the aluminum oxide film), the present inventors made a sample (comparative example) having a silicon oxide film formed on a silicon nitride film and a sample (this embodiment) having a layer containing aluminum or the like (aluminum oxide film) formed in contact with the interface thereof and checked how the leak current characteristics changed. FIG. 4 shows the relationship of the leak current density with respect to the applied electric field. More specifically, the sample as the comparative example in FIG. 4 is an MIS capacitor obtained by forming a silicon nitride film and a silicon oxide film on a silicon substrate. The sample as this embodiment in FIG. 4 is an MIS capacitor having a thin aluminum oxide film formed between a silicon nitride film and a silicon oxide film. The formation conditions of these samples are the same as those in the fabrication method of the non-volatile semiconductor storage device of this embodiment to be described later. The concentration of the aluminum atoms is adjusted to 1E14 atoms/cm². FIG. 4 shows the results obtained by injecting charges from the side of the silicon substrate to the silicon oxide film. In FIG. 4, the abscissa represents the applied voltage, while the ordinate represents the leak current density. As can be seen from FIG. 4, compared with the sample used as the comparative example, the sample of this embodiment displayed a decrease in the leak current density in almost the entire electric field region. Consequently, it has been confirmed the tunneling probability of charge can be lowered by forming the layer 8 containing aluminum or the like.

Figure 5:
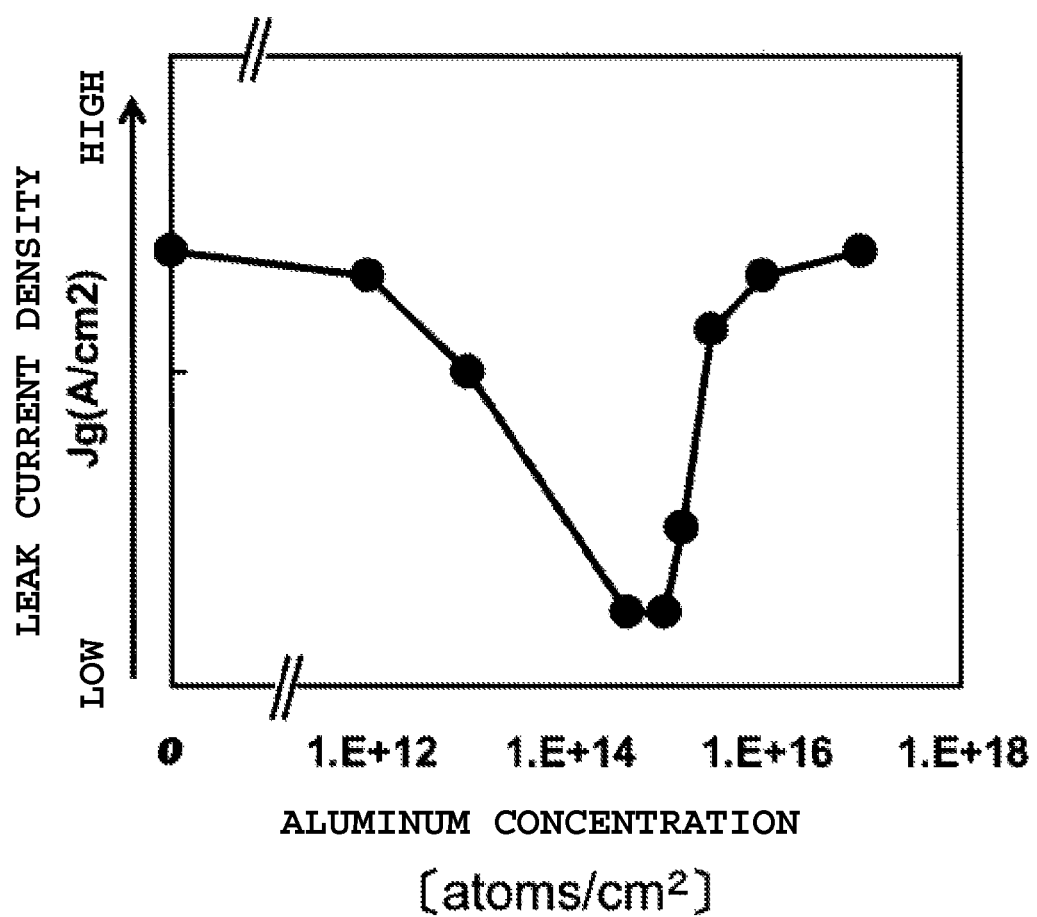
FIG. 5 is one example of a diagram (part 2) explaining this embodiment.

The present inventors also studied the relationship between the leak current and the concentration of the aluminum atoms in the layer 8 containing aluminum or the like (aluminum oxide film). FIG. 5 shows the relationship of the leak current density with respect to the concentration of the aluminum atoms. More specifically, multiple samples are obtained as MIS capacitors by forming a thin aluminum oxide film having a desired aluminum atom concentration on a silicon nitride film on a silicon substrate and then forming a silicon oxide film thereon. FIG. 5 shows the relationship between the concentration of the aluminum atoms and the leak current density when charges are injected from the side of the silicon substrate with respect to these samples. In FIG. 5, the abscissa represents the concentration of the aluminum atoms, while the ordinate represents the leak current density. The sample having no aluminum oxide film formed is used as the comparative example (the case when the density of the aluminum atoms is zero). According to FIG. 5, in the range studied by the present inventors, the leak current reducing effect can be realized from the samples whose aluminum atom concentration is 1E12 cm$^{-2}$ or higher. The leak current is reduced compared with the sample as the comparative example. On the other hand, for the samples with an aluminum atom concentration of 1E16 cm$^{-2}$ or higher, the leak current tends to increase compared with that of the sample used as the comparative example. According to the studies conducted by the present inventors, the sample having aluminum atom concentration near 1E14 cm$^{-2}$ has the best effect. It is inferred that there is an optimal value for the concentration of the aluminum atoms in order to realize the effect on reducing the leak current. Therefore, it is preferred to optimize the concentration of the aluminum atoms corresponding to the characteristics and the like required for the non-volatile semiconductor storage device in this embodiment.

Also, as described above, even if a metal film, nitride film, boride film, sulfide film, or carbide film is formed as the layer 8, the surface will be oxidized since the aluminum atoms thereof are easy to oxidize. Therefore, electric dipoles are generated to change the energy band structure. In addition, when various kinds of films are formed as the layer 8, the following effects can also be realized corresponding to the type of the film. More specifically, when an oxide film is formed, since the impurities caused by the aluminum source and the impurities adsorbed to the surface can be removed by the oxidant, a good oxide film can be formed. When a nitride film is formed, the nitrogen atoms on the surface are included into the film due to the nitriding agent during formation, and the oxide film on the surface becomes extremely thin. Therefore, more significantly polarized electric dipoles can be obtained so that the energy band structure can be changed more. When a boride film is formed, since the oxide of the boron (boron) atoms affects polarization of the electric dipoles, more significantly polarized electric dipoles can be obtained so that the energy band structure can be changed more. When a sulfide film or a carbide film is formed, a film containing aluminum atoms at lower concentration can be formed easily.

Also, as described above, the layer 8 containing aluminum or the like is not limited to a layer containing aluminum or the like but can also be a layer containing the following atoms.

For example, in the case of beryllium or other alkaline earth metal, since oxygen deficiency is difficult to form, the energy band structure can be changed more. This is particularly preferred in the case of reducing high electric field leakage. Also, for the alkaline earth metals, the smaller the atom number, the higher the oxygen retaining density. Therefore, it is considered that bigger electric dipoles can be generated. Consequently, it is preferred to use an atom with a smaller atom number than that of aluminum. In the case of boron, since boron has smaller atomic weight and higher oxygen density than aluminum, it is considered that bigger electric dipoles can be generated. However, since boron is easy to diffuse into the silicon oxide film, it is preferred to avoid diffusion of boron in order to generate the electric dipoles. For example, it is preferred to form the film at low temperature or use boron in the state of a nitride film.

The energy band structure on the lamination interface can also be changed using yttrium or other transition metals. More specifically, for example, when a thin hafnium oxide film is laminated on a silicon oxide film on a silicon substrate, since the silicon oxide film has higher oxygen density on the interface, the oxygen ions in the silicon oxide film shift to the side of the hafnium oxide film and electric dipoles are generated in the same way as described above. Also, in this case, since the electric dipoles are generated such that the negative charges are disposed in the oxide film on the side of the silicon substrate as the charge injection side and the positive charges are disposed in the oxide film positioned on the opposite side against the charge injection side, the energy band structure is changed on the side where the barrier to the charges is reduced. Consequently, since the energy band structure is changed such that the barrier height becomes low, the tunnel probability of charges increases, and the leak current is increased. Therefore, for example, when this structure is formed as the tunnel insulating film 2 of the non-volatile semiconductor storage device 100, since the charges trapped in the lower floating gate electrode 3 can be easily erased during the erasing operation, the stress applied to the tunnel insulating film 2 can be alleviated during the erasing operation. As a result, deterioration of the tunnel insulating film 2 can be avoided, and the reliability of the non-volatile semiconductor storage device 100 can be improved. According to the studies conducted by the present inventors, when a very thin hafnium oxide film is laminated on a silicon oxide film, with the concentration of the hafnium atoms in the range of $1E13$ atoms/cm$^2$-$1E16$ atoms/cm$^2$ measured in surface density, the leak current increases more than that in the case when no hafnium oxide film is formed. As described above, in this embodiment, it is preferred to optimize the type and density of the atoms included in the layer 8 containing aluminum or the like and the oxygen density corresponding to the desired characteristics of the non-volatile semiconductor storage device 100 and the site in the memory cell 10.

According to this embodiment, the energy band structure at the layer interfaces of the multi-layer insulating films can be changed to the optimal structure corresponding to the desired characteristics of the non-volatile semiconductor storage device 100 and the location in memory cell 10. More specifically, according to this embodiment, when the layer 8 containing aluminum or the like is formed in contact with at least one of the multiple interfaces of the multi-layer insulating films constituting the tunnel insulating film 2, the IFD film 4 and the IPD film 6, the energy band structure at the interfaces of the multi-layer insulating films is changed to improve the writing/erasing characteristic/retention characteristic of the non-volatile semiconductor storage device 100 and improve the stress resistance during writing/erasure to improve the reliability.

As a specific example, for the non-volatile semiconductor storage device 100 having the double floating gate-type cell structure according to this embodiment, when the layer 8 containing aluminum or the like is formed on the upper interface of the multi-layer insulating film constituting the tunnel insulating film 2, the leak current can be restrained, and the charge retaining characteristic can be improved. When the layer 8 containing hafnium or the like is formed on the upper interface of the multi-layer insulating film, the leak current on the erasure side can be increased to improve the erase characteristic, and the stress applied to the tunnel insulating film 2 during erasure can be alleviated to avoid deterioration of the tunnel insulating film 2. When the layer 8 containing aluminum or the like having the optimal configuration is formed to contact the interface of the multi-layer insulating film constituting the IFD film 4, optimal write characteristic and charge retaining characteristic can be realized. For example, when there are two or more interfaces of the multi-layer insulating film, if the layer 8 containing aluminum or the like is formed on the upper interface, the charge retaining characteristic can be improved without adversely affecting the write characteristic. This is because the amount of leaked electrons stored in the second charge storage film can be reduced without changing the amount of the electrons injected from the side of the silicon substrate. When the layer 8 containing aluminum or the like is formed to have contact with the interface of the multi-layer insulating film constituting the IPD film 6, the leak current can be reduced and the write characteristic/erase characteristic can be improved without thickening each insulating film constituting the IPD film 6. In particular, when shrinking of the non-volatile semiconductor storage device is required, since the quantity of the charges stored in each floating gate is reduced, further optimization of the characteristics of each insulating film is required. Consequently, since the energy band structure of each insulating film can be optimized according to this embodiment even for a fine non-volatile semiconductor storage device, good characteristics can be realized.

The effect of forming the layer 8 containing aluminum or the like that has been described so far is not limited to the combination of layer 8 containing aluminum or the like and silicon oxide film. The energy band structure can be changed by forming the layer 8 containing aluminum or the like to have contact with the interfaces for lamination of various kinds of combinations. For example, it is also possible to form the layer 8 containing aluminum or the like to have contact with an interface between the silicon oxide film and the silicon nitride film or an interface between the hafnium oxide film and the tungsten oxide film. The multi-layer insulating film constituting the tunnel insulating film 2, the IFD film 4, or the IPD film 6 can also have a structure that sandwiches the layer 8 containing aluminum or the like with silicon oxide films or the two sides thereof. The film that sandwiches the layer 8 containing aluminum or the like on the two sides is not limited to a silicon oxide film but can also be other oxide film or nitride films. That is, in this embodiment, the tunnel insulating film 2, the IFD film 4, and the IPD film 6 can use well-known multi-layer structures formed by depositing multiple insulating films. Examples of the lamination are listed below. In the following, various kinds of multi-layer insulating films will be explained, but the explanation of the layer 8 containing aluminum or the like included in the multi-layer insulating film is omitted. Consequently, although the layer 8 containing aluminum or the like will not be explained in detail below, the layer 8 containing aluminum or the like is formed on one of the interfaces of the multi-layer insulating film.

The multi-layer insulating film may have a 2-layer structure comprising different films: for example, a first oxide film/a second oxide film ($O_1O_2$) as layers of oxide films of different elements, a first nitride film/a second nitride film ($N_1N_2$) as layers of nitride films of different elements, an oxide film/modified oxide film (OO') as multi-layers formed an oxide film and a layer formed by modifying the oxide film, a modified oxide film/oxide film (O'O), a nitride film/modified nitride film (NN') as layers of a nitride film and a layer formed by modifying the nitride film, a modified nitride film/nitride film (N'N), an oxide film/nitride film (ON), a nitride film/oxide film (NO), an oxide film/high dielectric constant film (in this case, a film having higher dielectric constant than the silicon oxide film or a High-k film with dielectric constant of 7 or higher) (OH), a high dielectric constant film/oxide film (HO), and the like.

If the multi-layer insulating film has a 3-layer structure, the following multi-layer stacks can be used. First, examples of multi-layers having a vertically symmetric structure include an oxide film/nitride film/oxide film (ONO), a nitride film/oxide film/nitride film (NON), an oxide film/high dielectric constant film/oxide film (OHO), a high dielectric constant film/oxide film/high dielectric constant film (HOH), a nitride film/high dielectric constant film/nitride film (NHN), a first high dielectric constant film/second high dielectric constant film/first high dielectric constant film ($H_1H_2H_1$), a second high dielectric constant film/first high dielectric constant film/second high dielectric constant film ($H_2H_1H_2$), and the like. The first and second high dielectric constant films comprise different materials. Examples of multi-layer stacks having a vertically asymmetric structure include an oxide film/nitride film/high dielectric constant film (ONH), an oxide film/high dielectric constant film/nitride film (OHN), a nitride film/oxide film/high dielectric constant film (NOH), an oxide film/first high dielectric constant film/second high dielectric constant film ($OH_1H_2$), an oxide film/second high dielectric constant film/first high dielectric constant film ($OH_2H_1$), a nitride film/first high dielectric constant film/second high dielectric constant film ($NH_1H_2$), a nitride film/second high dielectric constant film/first high dielectric constant film ($NH_2H_1$), a first high dielectric constant film/oxide film/second high dielectric constant film ($H_1OH_2$), a second high dielectric constant film/oxide film/first high dielectric constant film ($H_2OH_1$), a first high dielectric constant film/nitride film/second high dielectric constant film ($H_1NH_2$), a second high dielectric constant film/nitride film/first high dielectric constant film ($H_2NH_1$), and the like. Even in the case of layering oxide films made of the same material, it is possible to change the conditions for treating the insulating films or the conditions for forming the insulating films in order to realize different charge trap densities. More specifically, examples of the stacks include an oxide film/nitride film/modified nitride film (ONN'), an oxide film/high dielectric constant film/modified high dielectric constant film (OHH'), and the like.

Where the multi-layer insulating film has three or more layers, examples include a high dielectric constant film/oxide film/high dielectric constant film/nitride film (HOHN), a nitride film/oxide film/high dielectric constant film/oxide film/nitride film (NOHON), a nitride film/oxide film/nitride film/oxide film/nitride film (NONON), and the like.

The reason of forming the multi-layered insulating film having a vertically symmetric structure is to realize both good write characteristics and erase characteristics. The reason for forming the multi-layered insulating film having a vertically asymmetric structure is to improve the write characteristic and to restrain charge from leaking into the upper electrode (floating gate, control gate, or the like) or improve the erase characteristic and restrain charge from leaking to the side of the semiconductor substrate.

Also, the reason for using an insulating film with dielectric constant of 7 or higher is to reduce the electrical film thickness while keeping the resistance to leakage current. Where the dielectric constant is high, the leakage current can be restrained effectively during application of a high electric field. More specifically, when a silicon oxide film is layered on a metal oxide with dielectric constant of 7 or higher, since leakage can be restrained during charge retention, it is possible to restrain leak at medium/low electric field strengths. When a silicon nitride film is layered on a metal oxide film with a dielectric constant of 7 or higher and an oxide film is formed thereon, it is possible to restrain the so-called bird's beak that occurs when an oxidant enters during etching to thicken part of the insulating film.

Examples of a high dielectric constant film with dielectric constant of 7 or higher include an aluminum oxide film ($Al_2O_3$) with dielectric constant of about 8, a magnesium oxide film (MgO) with specific dielectric constant of about 10, an yttrium oxide film ($Y_2O_3$) with specific dielectric constant of about 16, a hafnium oxide film ($HfO_2$), a zirconium oxide film ($ZrO_2$), and a lanthanum oxide film ($La_2O_3$) with specific dielectric constant of about 22. It is also possible to use a hafnium silicate film (HfSiO), a hafnium aluminate film (HfAlO), or other ternary compound films. Even an oxynitride film or nitride film can be used as long as the specific dielectric constant is higher than 7.

That is, in this embodiment, an oxide film, a nitride film, an oxynitride film containing at least one type of atom selected from silicon, aluminum, magnesium, yttrium, hafnium, zirconium, lanthanum, tantalum, tungsten, and the like can be used as the insulating film that constitutes the multi-layered insulating film.

In this embodiment, a lower floating gate 3, an upper floating gate 5, and a control gate 7 may also be formed of polysilicon films containing no doped impurities (dopants) or polysilicon films doped with phosphorous, boron, or other impurities (dopants). There is no special limitation as long as they are formed of metallic films, semi-metallic films, or semiconductor films. The lower floating gate 3 and the upper floating gate 5 can also have a 2-layered structure comprising two different films.

The non-volatile semiconductor storage device 100 having the double floating gate-type cell structure has been described for this embodiment. The present invention is not limited to this embodiment. For example, it is also possible to use a charge trap (CT) layer comprising a silicon nitride film, a hafnium oxide film ($HfO_2$), or other insulating film instead of the upper floating gate 5. When the charge trap layer is used as described above, the insulating film formed on the CT layer is known as a block (BLK) insulating film instead of the IPD film 6. It is also possible to use the well-known multi-layer insulating film formed by layering multiple insulating films such as the BLK insulating film. The charge trap layer can also have a 2-layer structure comprising two different films in the same way as described above.

In the following, the fabrication method of the non-volatile semiconductor storage device 100 according to this embodiment will be described based on FIGS. 6A-13P. FIGS. 6A-13P are cross-sectional views illustrating the intermediate fabrication steps of memory cell region of the non-volatile semiconductor storage device 100 shown in FIG. 2.

First, a silicon oxide film 21 is formed to a thickness of, for example, about 1-10 nm on a semiconductor substrate (a p-type silicon substrate or an n-type silicon substrate having p-type well formed thereon) 1 by well-known method. Then, annealing is carried out in a nitrogen monoxide gas atmosphere to introduce nitrogen into the silicon oxide film. The annealing is carried out at a temperature in the range of 700-950° C. As a result, nitrogen is included into the silicon oxide film, and oxygen emerges in the vicinity of the surface of the silicon oxide film. As shown in FIG. 6A, a resulting stack of a silicon nitride film 21 and a silicon oxide film 22 is formed on the semiconductor substrate 1. In this fabrication method, no layer 8 containing aluminum or the like is formed between the silicon nitride film 21 and the silicon oxide film 22. If necessary, however, it is also possible to form the layer 8 containing aluminum or the like between the silicon nitride film 21 and the silicon oxide film 22. In this case, instead of forming the silicon nitride film 21 on the silicon oxide film 22 as described above, well-known methods may be used to form the silicon nitride film 21 and then form the layer 8 containing aluminum or the like on the silicon nitride film 21, followed by forming the silicon oxide film 22 thereon.

Then, as shown in FIG. 6B, atoms of aluminum or the like are adsorbed on the silicon oxide film 22 to form the layer 8 containing aluminum or the like. This layer is not limited to a thin film shape. The atoms of aluminum or the like can be simply present on the silicon oxide film. Even if this layer has a thin film shape, the film has a thickness of about one atom. More specifically, this layer can be formed by arranging the atoms side by side. The concentration of the atoms in the layer 8 containing aluminum or the like is preferred to be in the range of 1E12 atoms/$cm^2$ to 1E16 atoms/$cm^2$. Since the inter-element distance is reduced significantly in company with miniaturization of the elements, the layer 8 containing aluminum or the like is desired to be thinner. This is because the electrical distance between the elements is further reduced when a thick layer is formed.

In this case, an aluminum oxide film 8 is formed as the layer 8 containing aluminum or the like. This aluminum oxide film 8 can be formed using the atomic layer deposition (ALD) method. More specifically, trimethyl aluminum (TMA) is used as the aluminum source and ozone is used as the oxidant to form the film at film formation temperature of 300° C. This ALD method is a method for forming a film in an atomic layer unit by repeating the sequence of supplying ozone or other active gas, purging by means of evacuation, supplying TMA or other metallic raw material gas, purging by means of evacuation, and supplying ozone or other active gas again for several rounds. It is also possible to use other methods other than the method described above to form the aluminum oxide film 8 in this embodiment. For example, it is also possible to use other alkyl aluminum gases formed by bonding alkyl groups other than the methyl group to aluminum atoms, amino-based materials formed by bonding amino groups to the aluminum atoms, aluminum halides, or other materials as the aluminum source. It is also possible to use ozone, water, oxygen, oxygen radicals, nitrous oxide, or other material as the oxidant. The film forming method is not limited to the ALD method. It is also possible to use a chemical vapor deposition (CVD) method, physical vapor deposition (PVD) method that takes advantage of physical excitation, coating method, or the method that dips the substrate in a solution containing the desired ions for adsorption.

When a nitride film is used instead of the aluminum oxide film, it is only necessary to feed a nitriding agent instead of the oxidant into the furnace. Ammonia, hydrazine, or radical nitrogen excited by a physical method can be used as the nitriding agent. Similarly, when a boride film is used, diborane, boron chloride, or other boron compound can be used as the boriding agent. When a sulfide film is used, hydrogen sulfide or the like can be used as the sulfating agent. When a carbide film is used, the film can be formed by using a carbon-based source containing an ethylene group or other organic groups.

Then, a silicon nitride film 23 is formed to a thickness of, for example, 0.1-3 nm using the ALD method. In this way, a tunnel insulating film 2 comprising a silicon nitride film 21, a silicon oxide film 22, a layer 8 containing aluminum or the like, and a silicon nitride film 23 is formed as shown in FIG. 7C.

Then, as shown in FIG. 7D, a lower floating gate 3 comprising a polysilicon film is formed to a thickness of about 1-50 nm using the CVD method on the tunnel insulating film 2.

Then, as shown in FIG. 8E, a silicon oxide film 41 is formed to a thickness of 0.1-3 nm using the ALD method.

Then, after the layer 8 containing aluminum or the like is formed on the silicon oxide film 41 in the same way as described above, a silicon nitride film 42 is formed to a thickness of 0.1-3 nm using the ALD method. In this way, the IFD film 4 comprising the silicon oxide film 41, the layer 8 containing aluminum or the like, and the silicon nitride film 42 is formed as shown in FIG. 8F.

Then, as shown in FIG. 9G, the upper floating gate 5 comprising a polysilicon film is formed to a thickness of about 1-50 nm using the CVD method on IFD film 4.

Then, a silicon nitride film 51 is formed to a thickness of 50-200 nm using the CVD method on the upper floating gate 5. After that, a silicon oxide film 52 is formed to a thickness of 50-400 nm using the CVD method on the silicon nitride film 51. In this way, the structure shown in FIG. 9H can be obtained.

Figure 10J:
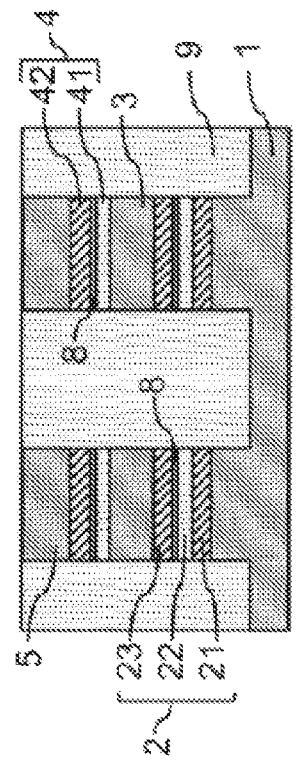
FIGS. 10I and 10J are examples of diagrams explaining a fabrication process (part 5) of the non-volatile semiconductor storage device according to this embodiment.
Figure 10I:
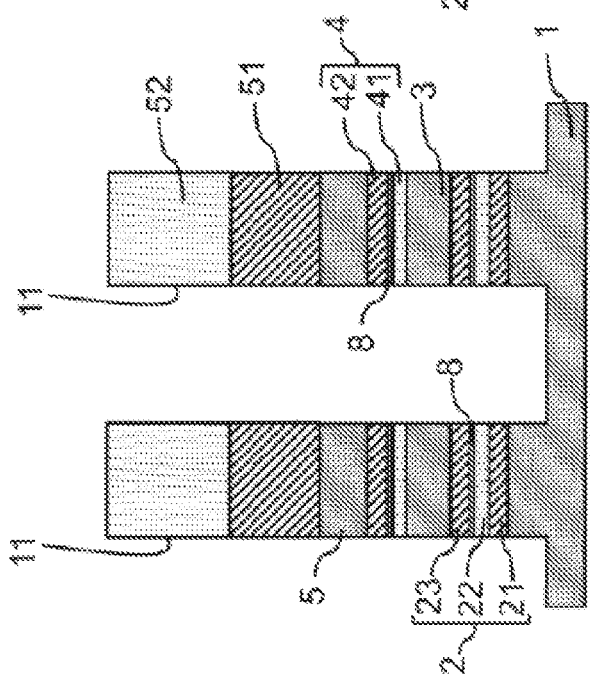

Then, a photoresist (not shown in the drawing) is coated on the silicon oxide film 52, and the photoresist is patterned by means of pattern exposure. Then, the silicon oxide film 52 is etched with the photoresist used as an anti-etching mask. After that, the photoresist is removed, and the silicon nitride film 51 is etched with the silicon oxide film 52 used as a mask. Then, the well-known method is used to sequentially etch the upper floating gate 5, the IFD film 4, the lower floating gate 3, the tunnel insulating film 2, and the semiconductor substrate 1 to form element separation grooves 11 used for the element separation insulating film as shown in FIG. 10I.

Then, the silicon oxide film 52 is removed, and a coating technology is used to form an element separation insulating film 9 comprising a silicon oxide film to a thickness of 200-1500 nm in element separation grooves 11. The density of element separation insulating film 9 is increased by treating element separation insulating film 9 in an oxygen atmosphere or a steam atmosphere. Then, with the silicon nitride film 51 used as a stopper, the top surface of the element separation insulating film 9 is flattened by means of the chemical mechanical polishing method (CMP). Then, the element separation insulating film 9 is etched under the etching conditions with the selection ratio to the silicon nitride film 51. In this way, the structure shown in FIG. 10J can be obtained.

Then, as shown in FIG. 11K, the radical nitriding method is used to form a silicon nitride film 61 on the top surface of the upper floating gate 5 and the element separation insulating film 9. This radical nitriding method uses nitrogen excited physically by plasma or the like as the nitriding seed. For example, as a formation condition of a silicon nitride film nitrogen radicals are generated by generating microwave in an atmosphere containing nitrogen gas. The nitrogen radicals are used to form a silicon nitride film 61 on the silicon-containing layer. For example, in this case, the microwave strength is in the range of 100-3000 W. The processing pressure is in the range of 5-30 Pa, and the substrate temperature is in the range of 350-900° C. When this method is used, the top surface of the upper floating gate can be nitrided to form (grow) the silicon nitride film 61. Also, since the nitriding amount is dependent on the processing conditions, the thickness of the silicon nitride film 61 can be adjusted precisely. In addition, as the merits of the radical based nitriding method, the processing temperature is low, and the processing time can be shortened. Also, this method is beneficial for the controllability of the thin film. The method for forming the silicon nitride film 61 is not limited to the radical nitriding method. For example, it is also possible to use the ALD method described above.

Then, the layer 8 containing aluminum or the like is formed on the silicon nitride film 61 in the same way as described above. After that, nitrous oxide ($N_2O$) is reacted at a temperature of about 800° C. using the low-pressure chemical vapor deposition (LP-CVD) method on the layer 8 containing aluminum or the like to form the silicon oxide film 62 with a thickness in the range of about 1-10 nm. In this way, the structure shown in FIG. 11L can be obtained.

Figure 12M:
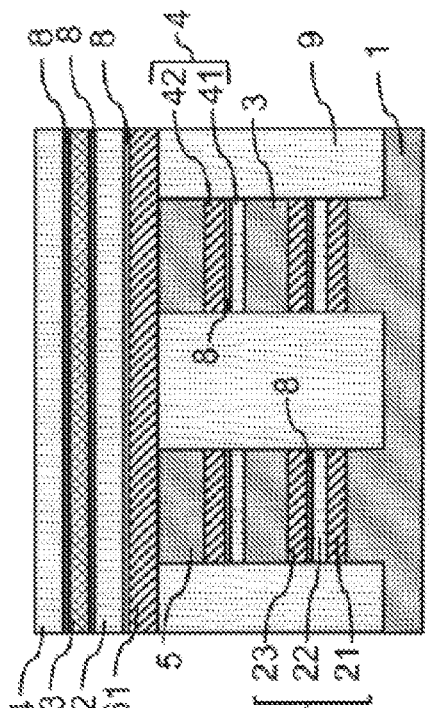
FIGS. 12M and 12N are examples of diagrams explaining a fabrication process (part 7) of the non-volatile semiconductor storage device according to this embodiment.

Then, the layer 8 containing aluminum or the like is formed on the silicon oxide film 62 in the same way as described above. After that, the hafnium oxide film 63 is formed as a metal oxide film to a thickness in the range of 1-10 nm on the layer 8 containing aluminum or the like as shown in FIG. 12M. More specifically, the hafnium oxide film 63 can be formed at a temperature in the range of 150-450° C. using the ALD method that uses hafnium chloride and water. It is also possible to use amine-based compound or other organic source instead of hafnium chloride as the hafnium source.

Figure 12N:
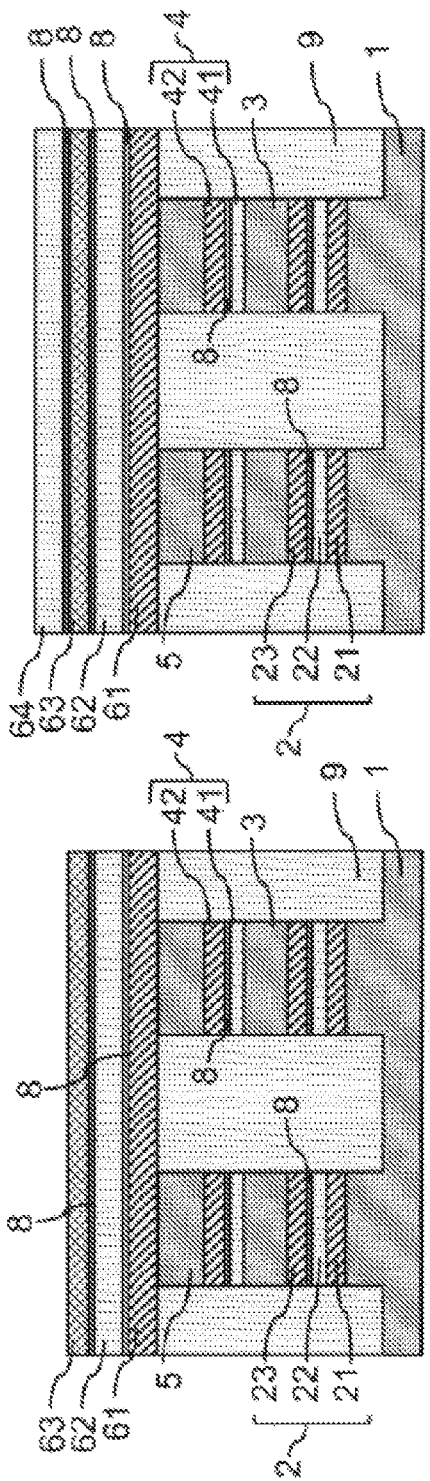

Then, the layer 8 containing aluminum or the like is formed on the hafnium oxide film 63 in the same way as described above. Then, the well-known method is used to form the silicon oxide film 64 with a thickness in the range of 1-10 nm on the layer 8 containing aluminum or the like as shown in FIG. 12N.

Then, the layer 8 containing aluminum or the like is formed on the silicon oxide film 64 in the same way as described above. After that, the silicon nitride film 65 is formed to a thickness of 0.1-5 nm using the ALD method on the layer 8 containing aluminum or the like as shown in FIG. 13O.

Then, a control gate 7 comprising a polysilicon film is formed using the well-known method on the silicon nitride film 65. After the control gate 7 is patterned by means of pattern exposure, the non-volatile semiconductor storage device 100 having the memory cell 10 as shown in FIG. 13P is obtained after undergoing the normal post treatment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An integrated circuit memory, comprising:
a semiconductor layer;
a first charge storage layer overlying the semiconductor layer;
a first dielectric overlying the first charge storage layer;
a first metal layer overlying the first dielectric;
a second dielectric overlying the first metal layer;
a second charge storage layer overlying the second dielectric; and
a gate electrode overlying the second charge storage layer, wherein the first and second dielectric comprise an oxide, a nitride, or combinations of an oxide and a nitride.

2. The integrated circuit memory of claim 1, further including a tunnel insulating layer contacting the first charge storage layer.

3. The integrated circuit memory of claim 2, wherein the tunnel insulating layer includes a third dielectric layer overlying the semiconductor layer;
a second metal layer overlying the third dielectric layer; and
a fourth dielectric overlying the second metal layer.

4. The integrated circuit memory of claim 1, wherein the metal layer includes any one type of atomic species selected from aluminum, a transition metal, alkaline earth metals, boron and sulpher.

5. The integrated circuit memory of claim 1, wherein first metal layer comprises aluminum oxide.

6. The integrated circuit of claim 5, wherein the aluminum layer comprises at least 1E12 atoms/$cm^2$.

7. The integrated circuit of claim 5, wherein the aluminum layer comprises less than 1E16 atoms/cm$^2$.

8. The integrated circuit memory of claim 1, further including an interpoly dielectric film overlaying the second charge storage layer and provided below the gate electrode, the interpoly dielectric film having at least two dielectric layers with a metal layer interposed therebetween.

\* \* \* \* \*